United States Patent
Chang et al.

(10) Patent No.: US 8,669,615 B1
(45) Date of Patent: Mar. 11, 2014

(54) TECHNIQUES FOR METAL GATE WORKFUNCTION ENGINEERING TO ENABLE MULTIPLE THRESHOLD VOLTAGE FINFET DEVICES

(75) Inventors: Josephine B. Chang, Mahopac, NY (US); Isaac Lauer, Yorktown Heights, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,257

(22) Filed: Sep. 12, 2012

Related U.S. Application Data (63) Continuation of application No. 13/596,687, filed on Aug. 28, 2012.

(51) Int. Cl.
*H01L 27/092* (2006.01)

(52) U.S. Cl.
USPC .......... 257/347; 257/392; 257/E27.061; 257/E21.631; 438/289

(58) Field of Classification Search
USPC .......... 257/392, E27.061, E21.631, 347; 438/289
See application file for complete search history.

(56) References Cited

U.S. PATENT DOCUMENTS

| | | | |
|---|---|---|---|
| 6,444,512 B1 | 9/2002 | Madhukar et al. | |
| 7,807,525 B2 | 10/2010 | Doris et al. | |
| 7,879,669 B1 | 2/2011 | Teng et al. | |
| 7,923,337 B2 | 4/2011 | Chang et al. | |
| 2002/0074612 A1 | 6/2002 | Bulucea et al. | |
| 2005/0019993 A1* | 1/2005 | Lee et al. | 438/157 |
| 2005/0051812 A1* | 3/2005 | Dixit et al. | 257/250 |
| 2007/0052037 A1* | 3/2007 | Luan | 257/369 |
| 2007/0075351 A1* | 4/2007 | Schulz et al. | 257/314 |
| 2007/0196961 A1* | 8/2007 | Vitale | 438/147 |
| 2007/0292996 A1* | 12/2007 | Abadeer et al. | 438/165 |
| 2008/0093699 A1 | 4/2008 | Abe et al. | |
| 2009/0084181 A1* | 4/2009 | Kolb et al. | 73/514.16 |
| 2009/0309167 A1* | 12/2009 | Russ et al. | 257/370 |
| 2011/0053361 A1 | 3/2011 | Muralidhar et al. | |

(Continued)

OTHER PUBLICATIONS

Title: proportional Visited date: Feb. 12, 2013 Publisher: Merriam-Webster (www.meriam-webster.com/dictionary/proportional) Pertinent Page: p. 1.*

(Continued)

*Primary Examiner* — Kevin Parendo
*Assistant Examiner* — Lamont Koo
(74) *Attorney, Agent, or Firm* — Louis J. Percello; Michael J. Chang, LLC (57) ABSTRACT

Techniques are provided for gate work function engineering in FIN FET devices using a work function setting material an amount of which is provided proportional to fin pitch. In one aspect, a FIN FET device is provided. The FIN FET device includes a SOI wafer having an oxide layer and a SOI layer over a BOX, and a plurality of fins patterned in the oxide layer and the SOI layer; an interfacial oxide on the fins; and at least one gate stack on the interfacial oxide, the gate stack having (i) a conformal gate dielectric layer present, (ii) a conformal gate metal layer, and (iii) a conformal work function setting material layer. A volume of the conformal gate metal layer and a volume of the conformal work function setting material layer present in the gate stack is proportional to a pitch of the fins.

15 Claims, 7 Drawing Sheets

(56) References Cited

U.S. PATENT DOCUMENTS

2011/0111596 A1    5/2011   Kanakasabapathy
2011/0298018 A1   12/2011   Yin et al.
2013/0134486 A1*   5/2013   LiCausi .................. 257/288

OTHER PUBLICATIONS

K. Choi et al., "The effect of metal thickness, overlayer and high-k surface treatment on the effective work function of metal electrode," Proceedings of 35th European Solid-State Device Research Conference, ESSDERC 2005, Sep. 12-16, 2005, pp. 101-104.

I. Ferain et al., "Metal gate thickness optimization for MuGFET performance improvement," 38th European Solid-State Device Research Conference, 2008. ESSDERC, Sep. 15-19, 2008, pp. 202-205.

M. M. Hussain et al., "Gate-First Integration of Tunable Work Function Metal Gates of Different Thicknesses Into High-k/Metal Gates CMOS FinFETs for Multi-VTh Engineering," IEEE Transactions on Electron Devices, Mar. 2010, vol. 57, No. 3, pp. 626-631.

T.-H. Kim et al., "Utilizing Reverse Short-Channel Effect for Optimal Subthreshold Circuit Design," IEEE Transactions on Very Large Scale Integration (VLSI) Systems, Jul. 2007, vol. 15, No. 7, pp. 821-829.

\* cited by examiner

| Feature | Value (in nanometers (nm)) |
|---|---|
| Fin width | ~6-14nm |
| Fin Height | ~15-30nm |
| Fin Pitch | ~20-60nm |

TECHNIQUES FOR METAL GATE WORKFUNCTION ENGINEERING TO ENABLE MULTIPLE THRESHOLD VOLTAGE FINFET DEVICES

CROSS-REFERENCE TO RELATED APPLICATION(S)

This application is a continuation of U.S. application Ser. No. 13/596,687 filed on Aug. 28, 2012, the disclosure of which is incorporated by reference herein.

FIELD OF THE INVENTION

The present invention relates to FIN field-effect transistor (FET) devices, and more particularly, to techniques for gate work function engineering using a work function setting material an amount of which is provided proportional to fin pitch so as to enable multiple threshold voltage devices.

BACKGROUND OF THE INVENTION

In current complementary metal-oxide semiconductor (CMOS) scaling, the use of undoped FIN field-effect transistor (FET) devices is highly preferred as a device choice for CMOS at and beyond the 22 nanometer (nm) node. One key problem with undoped devices is the implementation of multiple threshold voltage (Vt) devices. One solution is to dope the FINFET device. To do so, however, for aggressively scaled devices has serious drawbacks from random dopant fluctuation (RDF) effects. One can also engineer gate stacks with different work functions for different Vt's. This however requires a substantial amount of process complexity.

Therefore, improved techniques for fabricating multiple Vt FINFET devices that avoid the above-described drawbacks would be desirable.

SUMMARY OF THE INVENTION

The present invention provides techniques for gate work function engineering in FIN field-effect transistor (FET) devices using a work function setting material an amount of which is provided proportional to fin pitch. In one aspect of the invention, a method of fabricating a FIN FET device is provided. The method includes the following steps. A semiconductor-on-insulator (SOI) wafer having a SOI layer over a buried oxide (BOX) is provided. An oxide layer is formed over the SOI layer. A plurality of fins is patterned in the SOI layer and the oxide layer. An interfacial oxide is formed on the fins. A conformal gate dielectric layer is deposited over the interfacial oxide. A conformal gate metal layer is deposited on the conformal gate dielectric layer. A conformal work function setting material layer is deposited on the conformal gate metal layer to form at least one gate stack over the fins. A volume of the conformal gate metal layer and a volume of the conformal work function setting material layer deposited over the fins is proportional to a pitch of the fins.

In another aspect of the invention, a FIN FET device is provided. The FIN FET device includes a SOI wafer having an oxide layer and a SOI layer over a BOX, and a plurality of fins patterned in the oxide layer and the SOI layer; an interfacial oxide on the fins; and at least one gate stack on the interfacial oxide, the gate stack having (i) a conformal gate dielectric layer present on the interfacial oxide, (ii) a conformal gate metal layer on the conformal gate dielectric layer, and (iii) a conformal work function setting material layer on the conformal gate metal layer. A volume of the conformal gate metal layer and a volume of the conformal work function setting material layer present in the gate stack is proportional to a pitch of the fins.

A more complete understanding of the present invention, as well as further features and advantages of the present invention, will be obtained by reference to the following detailed description and drawings.

DETAILED DESCRIPTION OF PREFERRED EMBODIMENTS

As described above, there are notable disadvantages associated with using doping and/or different work function gate stacks to produce multiple threshold voltage (Vt) FIN field-effect transistor (FET) devices. Advantageously, provided herein are techniques for producing multiple Vt FINFET devices using a work function setting material in an amount that is continuously modulated as a function of FIN pitch. Namely, a thickness of the materials in the device gate stacks will be chosen such that less work function setting material ends up in the tighter pitch FINFETs. Thus, for smaller pitch, higher FINFET Vt is obtained and therefore, through FIN pitch variation, different Vt devices may be fabricated. The technique does come at the cost of FIN active width density, however if the lower Vt (wider FIN pitch) devices are not used for a large fraction of the chip area, this trade-off may be very preferred over the use of more complex (and yield challenging) integration schemes.

The present techniques are applicable in gate-first fin-first, gate-last fin-first, and gate-last fin-last process flows. In general, a gate-first approach to FINFET device fabrication involves patterning one or more fin-shaped channels and forming a gate(s) over the channels. A gate-last fin-first approach involves patterning one or more fin-shaped channels, forming a dummy gate(s) over the channels, then removing the dummy gate a replacing with metal material late in the flow. A gate-last fin-last approach was developed to improve the fin patterning process and to permit self-aligned source and drain formation. See, for example, U.S. Pat. No. 7,923,337 issued to Chang et al., entitled "Fin Field Effect Transistor Devices with Self-Aligned Source and Drain Regions, the contents of which are incorporated by reference herein. With either gate-last approach, a dummy gate is formed early in the process and then, late in the process flow, is removed and replaced with a replacement gate. Advantageously, the present techniques are easily integrated in either a gate-first or a gate-last approach where the gate is formed over a silicon wafer.

The present techniques will be described by way of reference to FIGS. 1-11. The process illustrated is representative of the steps that may be performed after removal of the dummy gate in a gate-last approach or beginning at the fin patterning stage in a gate-first approach. Further, the figures provided illustrate use of a side wall image transfer (SIT) process to pattern the fins. However, it is to be understood that any fin lithography process may be employed in the same manner. The advantage to a SIT process is that it permits scaling beyond that achievable using standard lithography. As will be described in detail below, a SIT process can involve use of a sacrificial mandrel (typically formed from polysilicon) to place spacers. Once the mandrel is removed, the spacers can be used as a hardmask to pattern the fins.

Figure 1:
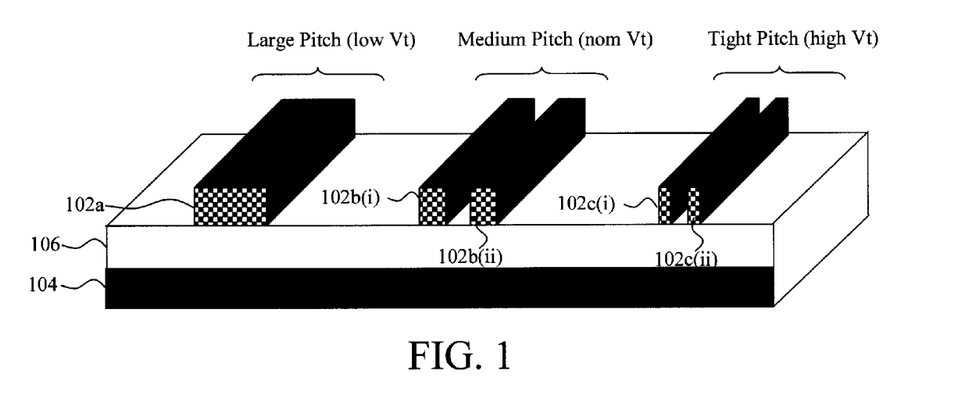
FIG. 1 is a three-dimensional diagram illustrating poly-silicon mandrels having been formed on a starting wafer (i.e., a silicon-on-insulator (SOI) wafer having an SOI layer and an oxide layer over the SOI layer) according to an embodiment of the present invention.
Figure 2:
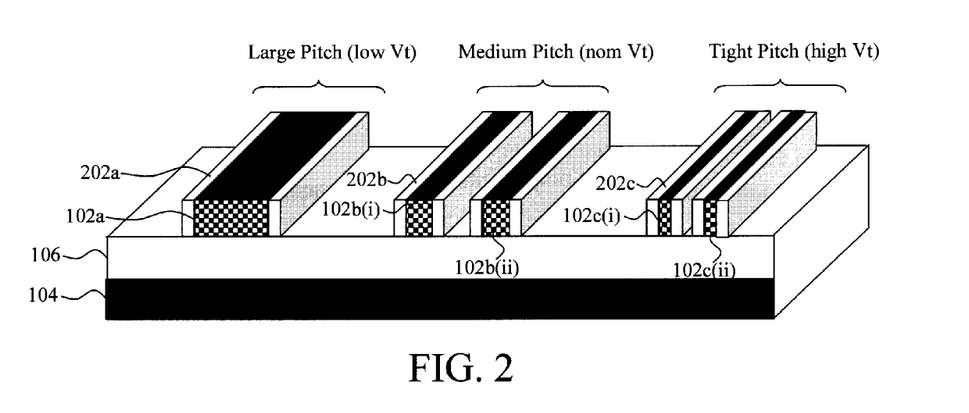
FIG. 2 is a three-dimensional diagram illustrating spacers having been formed on opposite sides of the poly-silicon mandrels according to an embodiment of the present invention.
Figure 3:
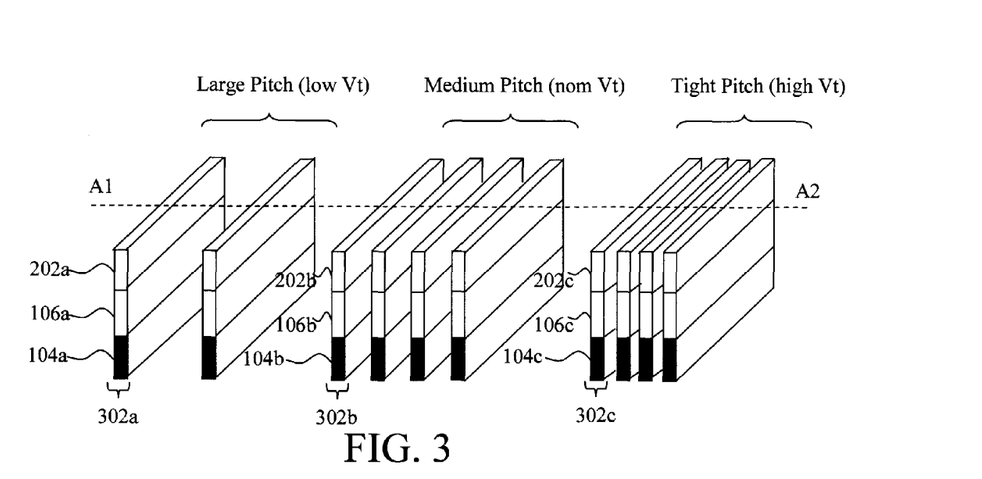
FIG. 3 is a three-dimensional diagram illustrating the spacers having been used as a hardmask to pattern fins in the SOI layer/oxide layer according to an embodiment of the present invention.

Accordingly, FIG. 1 is a three-dimensional diagram illustrating poly-silicon mandrels 102a, 102b(i)/102b(ii), and 102c(i)/102c(ii) having been formed on a starting wafer. In the exemplary embodiment depicted, multiple FINFET devices will be fabricated on the starting wafer (each device being formed with varying fin pitch). For purposes of illustrating the present techniques, three FINFET devices will be produced, namely a large pitch FINFET, a medium pitch FINFET and a tight pitch FINFET. By way of example only, according to an exemplary embodiment, a tight FINFET pitch may be from about 20 nanometers (nm) to about 40 nm, whereas a wide pitch may be from about 40 nm to about 80 nm. Thus, according to an exemplary embodiment, fin pitch values range from about 20 nm to about 80 nm. Fin pitch is defined as the distance from the center of one fin to the center of an adjacent fin(s).

Of course, this configuration of devices is merely exemplary and any other combination of devices, or even a single device, may be obtained using the present techniques. As will be described in detail below, a work function setting material(s) will be used in the gate stacks of the devices. The work function setting material acts as a doping source, and by way of the present process serves to change the workfunction of the gate stacks. Since the work function setting material acts as a doping source, advantageously, the present process flow permits the same gate metal to be used in each of the devices being formed (which simplifies the fabrication process). A different work function setting material can then be employed depending, e.g., on whether an n-channel FINFET or a p-channel FINFET is desired. During subsequent processing, the work function setting material from the gate stack can be diffused into the surrounding dielectric or gate metal to change the threshold voltage of the device. In one embodiment, the more work function setting material present in the gate, the lower the threshold voltage ($V_T$) of the device may be. Thus, by adding a larger volume of work function setting material to the gate stack, the threshold voltages of the resulting devices can be lowered. In some deposition process such as CVD or angled evaporation, the volume of work function setting material deposited on a fin sidewall can be designed to vary with fin pitch for pitches within a certain window. In general, the volume of work function setting material reduces as fin pitch decreases. In this case, tighter fin pitch would result in a higher threshold device. This is why three devices of varying fin pitch are shown in the figures so as to illustrate this aspect of the present techniques.

Accordingly, by way of the present techniques, more of the work function setting material will be deposited in the larger pitch devices as compared to the medium pitch devices, and more of the work function setting material will get deposited in the medium pitch devices as compared to the tight pitch devices. Thus, as a result, the threshold voltage of the large pitch device will be lower than that of the medium pitch device, and the threshold voltage of the medium pitch device will be lower than that of the tight pitch device. Varying the threshold voltage proportional to pitch allows for the creation of multiple threshold voltage devices on one chip without the use of either doping or multiple work function materials.

According to an exemplary embodiment, the starting wafer is a semiconductor-on-insulator (SOI) wafer. An SOI wafer generally includes an SOI layer (here SOI layer 104) separated from a substrate by a buried oxide or BOX. For ease and clarity of depiction, the BOX and underlying substrate are not shown (the BOX will be shown in later depictions to illustrate an orientation of the fins relative to the underlying wafer). Suitable semiconductor materials for use in SOI layer 104 include, but are not limited to, silicon, germanium, silicon germanium, and silicon carbon.

An oxide layer (e.g., silicon dioxide) 106 is present on the SOI layer 104. Oxide layer 106 can be deposited on the SOI layer 104 using a process such as chemical vapor deposition (CVD) or grown on SOI layer 104, e.g., by a thermal oxidation process. The poly-silicon mandrels can be formed on the SOI layer 104 by blanket depositing a layer of poly-silicon and then patterning the poly-silicon layer, e.g., using a directional reactive ion etching (RIE) process. It is notable that (as will be apparent from the description provided below) the number of mandrels being formed in this step is a function of the number of fins to be formed for each FINFET device. The number of fins being produced in the example shown (and hence the number of mandrels required) is merely to illustrate the present techniques.

The next step in the SIT process is to form spacers 202a, 202b and 202c on opposite sides of the poly-silicon mandrels 102a, 102b(i)/102b(ii), and 102c(i)/102c(ii), respectively. See FIG. 2. As will be described in detail below, once the poly-silicon mandrels are removed, the spacers can be used as a hardmask to pattern fins in the SOI layer 104/oxide layer 106. Advantageously, this SIT process permits scaling fin dimensions beyond what is achievable using standard lithography techniques. See, for example, U.S. Patent Application Publication Number 2011/0111596 filed by Kanakasabapathy, entitled "Sidewall Image Transfer Using the Lithography Stack as the Mandrel," the contents of which are incorporated by reference herein. According to an exemplary embodiment, the spacers are formed by first depositing a suitable spacer material (such as silicon nitride) onto the wafer, and then patterning the material into the spacers.

The poly-silicon mandrels can next be removed (selective to the spacers) using wet chemical etching or dry etching. The spacers are then used as a hardmask to pattern fins 302a, 302b and 302c in the SOI layer 104/oxide layer 106. See FIG. 3. According to an exemplary embodiment, the fins are patterned (with the spacers acting as a hardmask) using a directional RIE process. The now-patterned SOI layer 104/oxide layer 106 are herein after given the reference numerals 104a-c and 106a-c, respectively.

Figure 4:
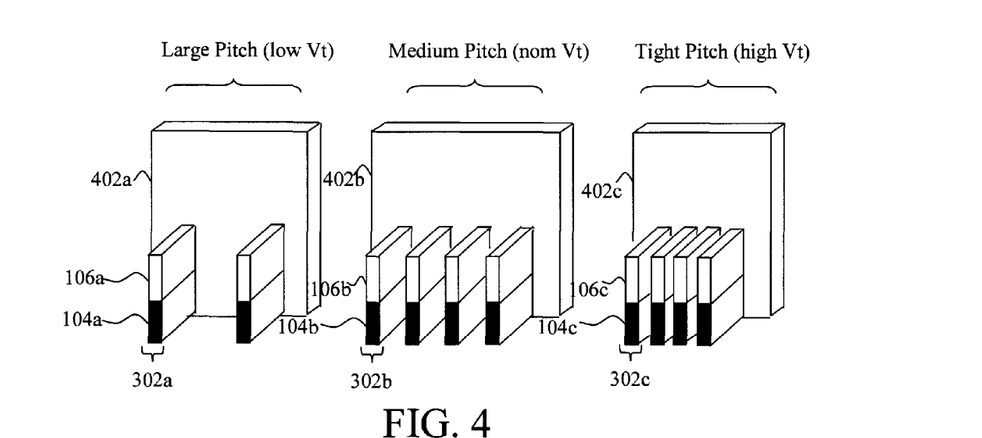
FIG. 4 is a three-dimensional diagram illustrating gate stacks having been formed on a portion of the fins that will serve as channel regions of the FIN FET devices according to an embodiment of the present invention.

Following patterning of the fins, gate stacks 402a, 402b, and 402c are formed for each of the FIN FET devices covering a portion of the fins which will serve as channel regions of the respective (large pitch, medium pitch and tight pitch) devices. See FIG. 4. As highlighted above, and as will be described in detail below, the gate stacks will each contain a work function setting material, an amount of which (by way of the present fabrication process) is proportional to the fin pitch of the device. The work function setting material (i) acts as a doping source, and by way of the present process serves to change the work function of the gate stacks, and (ii) will diffuse into the surrounding gate metal or dielectric to change the threshold voltage of the device. As also shown in FIG. 4, the SIT fin patterning hardmask (formed from the spacers, see above) has been removed prior to gate deposition. In order to illustrate the present gate stack fabrication process in detail, reference is now made to cross-sectional cuts through the fins (i.e., cross-sectional cuts along line A1-A2 through the fins, see FIG. 3).

Figure 5:
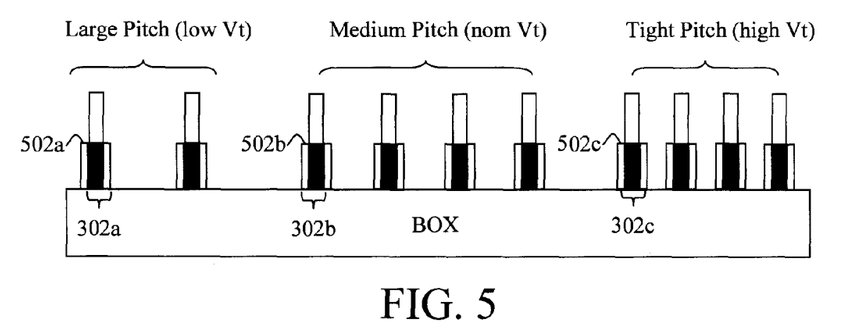
FIG. 5 is a cross-sectional diagram illustrating (with regard to gate stack formation) interfacial oxide layers having been formed on the fins according to an embodiment of the present invention.
Figure 6:
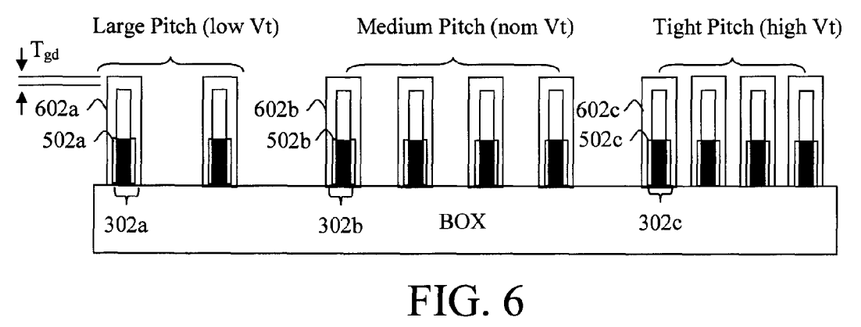
FIG. 6 is a cross-sectional diagram illustrating (with regard to gate stack formation) gate dielectric layers having been formed on the interfacial oxide layers according to an embodiment of the present invention.

Namely, FIG. 5 is a cross-sectional diagram illustrating that in the first step of the gate stack fabrication process an interfacial oxide 502a, 502b and 502c is formed on each of the fins 302a, 302b, and 302c, respectively. The interfacial oxide prepares the fins for the subsequent deposition of a high-k gate dielectric (see below). The interfacial oxide will form, for example, by exposing the wafer to an oxygen-containing environment. The interfacial oxide will form only on the exposed silicon surfaces. According to an exemplary embodiment, the interfacial oxide is formed to a thickness from about 0.5 nm to about 10 nm. As provided above, the SIT fin patterning hardmask (formed from the spacers, see above) may be removed prior to gate deposition, e.g., using a wet etching process. The buried oxide or BOX is shown in FIG. 5 and thereafter to illustrate an orientation of the fins relative to the underlying wafer.

Conformal gate dielectric layers 602a, 602b, and 602c are then deposited over the interfacial oxide 502a, 502b and 502c, respectively. See FIG. 6. According to an exemplary embodiment, the gate dielectric layers are formed from a high-k dielectric material, such as hafnium oxide and hafnium silicon-oxynitride. Suitable conformal deposition processes include, but are not limited to atomic layer deposition (ALD) or chemical vapor deposition (CVD). By way of example only, the gate dielectric layers are each deposited to a thickness $t_{gd}$ (see FIG. 6) of from about 1 nm to about 5 nm.

Figure 7:
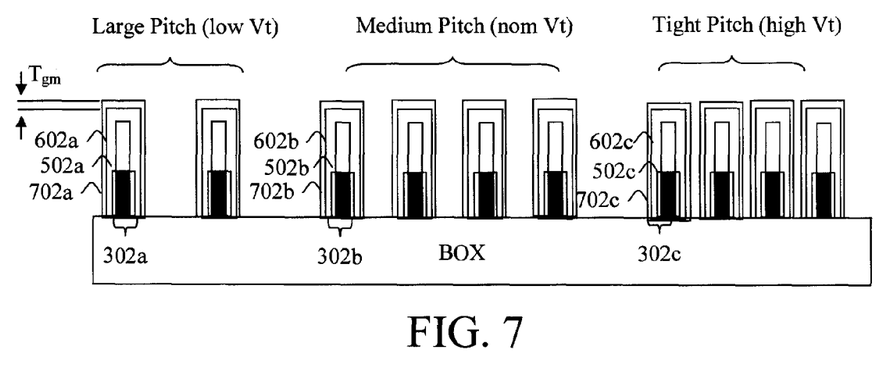
FIG. 7 is a cross-sectional diagram illustrating (with regard to gate stack formation) gate metal layers having been formed on the gate dielectric layers according to an embodiment of the present invention.

Next, as shown in FIG. 7, conformal gate metal layers 702a, 702b, and 702c are deposited on the gate dielectric layers 602a, 602b, and 602c, respectively. According to an exemplary embodiment, the gate metal layers include a metal (s) such as titanium and/or tantalum, e.g., titanium nitride and/or tantalum nitride. Suitable deposition processes for conformally depositing the gate metal (especially in the case of titanium and tantalum gate metals) include, but are not limited to ALD and CVD.

As will be described in detail below, a work function setting material(s) will be deposited onto the gate metal. The work function setting material acts as a doping source, and by way of the present process serves to change the work function of the gate stacks. Since the work function setting material acts as a doping source, advantageously, the present process flow permits the same gate metal to be used in each of the devices being formed (which simplifies the fabrication process). A different work function setting material can then be employed depending, e.g., on whether an n-channel FIN FET or a p-channel FIN FET is desired. Further, the metal from the gate stack will diffuse into the surrounding gate metal or dielectric to change the threshold voltage of the device. Specifically, the more metal present in the gate, the lower the threshold voltage ($V_T$) of the device. Thus, by modulating the volume of work function setting material added to the gate stack proportionally to the fin pitch, the threshold voltage of a device can be effectively modulated by fin pitch.

Accordingly, the volume of the gate metal layers and the volume of the work function setting material (to be deposited as described below) are important parameters to the present process. According to the present techniques, the volume of these layers is quantified based on the thickness of these layers. By way of example only, as shown in FIG. 7, the gate metal layers are deposited to a thickness $T_{gm}$ of (i.e., a uniform thickness across all of the devices) from about 5 nm to about 20 nm.

Figure 8:
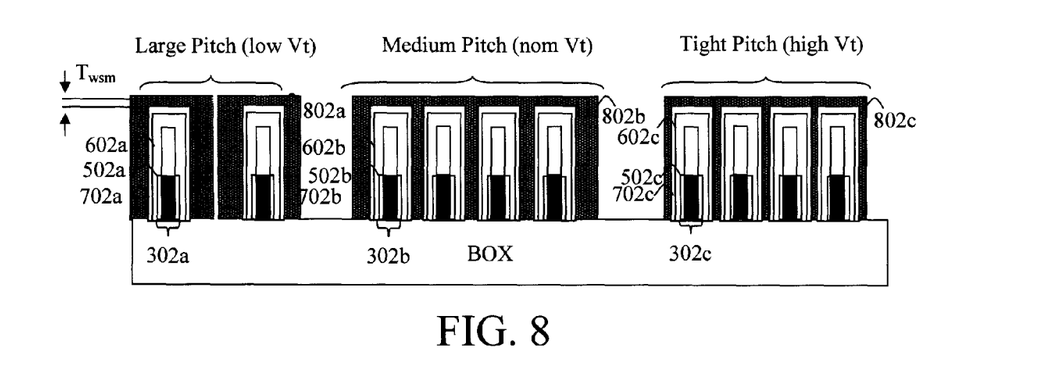
FIG. 8 is a cross-sectional diagram illustrating (with regard to gate stack formation) work function setting material layers having been formed on the gate metal layers according to an embodiment of the present invention.
Figure 9:
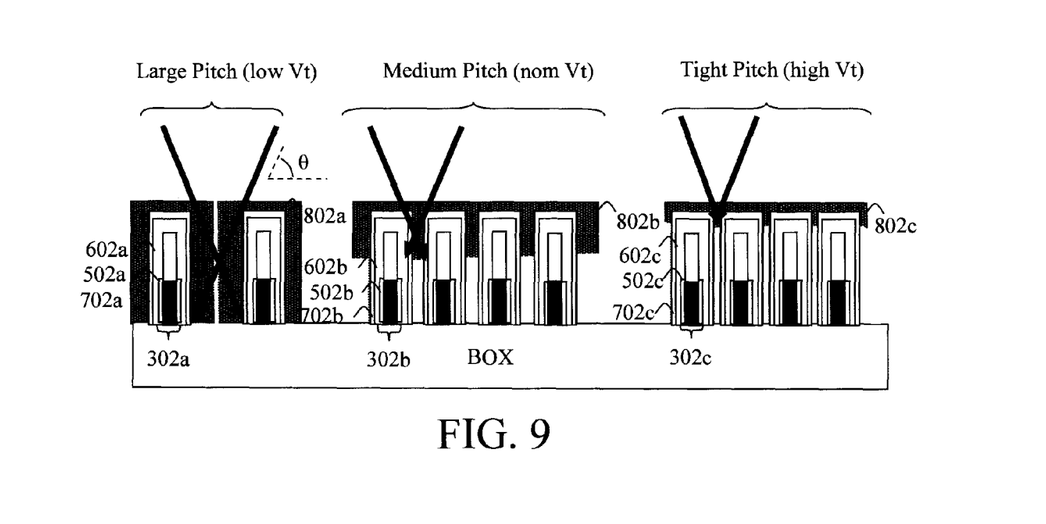
FIG. 9 is a cross-sectional diagram illustrating an angled deposition process being used to deposit the work function setting material according to an embodiment of the present invention.

Next, as shown in FIG. 8, conformal work function setting material layers 802a, 802b, and 802c are deposited on the gate metal layers 702a, 702b, and 702c, respectively. As provided above, the work function setting material acts as a doping source, and a different work function setting material can then be employed depending on whether a re-channel FIN FET or a p-channel FIN FET device is desired. Thus, the same gate metal (e.g., titanium nitride or tantalum nitride) can be used in each of the devices, yet a different (if so desired) work function setting material can be used in one or more devices to obtain a different doping polarity. By way of example only, suitable work function setting materials for use in p-channel FIN FET devices include, but are not limited to aluminum, dysprosium, gadolinium, and ytterbium. Suitable work function setting materials for use in n-channel FIN FET devices include, but are not limited to lanthanum, titanium, and tantalum. Suitable deposition processes for conformally depositing the work function setting material(s) include, but are not limited to CVD. Conventional CVD processes can be tuned such that deposited thickness on a fin sidewall is proportional to fin pitch by, for example, operating in a flow-limited regime where the flow of reactants and by-products is more restricted in the space between fins at a smaller fin pitch. Alternatively, as will be described in detail below, an angled work function metal deposition process, such as evaporation or sputtering, may be employed so as to further control the amount of work function setting material deposited in proportion to the device pitch.

As also described above, the work function setting material serves to lower the threshold voltage ($V_T$) of the device. Advantageously, by way of the present process, the work function setting material(s) can be deposited to a given thickness ($T_{wsm}$, see FIG. 8) throughout the devices (e.g., to a thickness of from about 5 nm to about 20 nm), but because of the configuration of the gate stacks, the volume of work function setting material present in each gate stack will be proportional to the pitch of the fins. See for example in FIG. 8 where it is shown that a greater volume of work function setting material is present in the large pitch FIN FET versus the medium pitch FIN FET, and a greater volume of work function setting material is present in the medium pitch FIN FET versus the tight pitch FIN FET. The present techniques rely on using the FIN pitch variation to intentionally vary the amount (volume) of the work function setting material. Therefore, the amount (volume) of the work function setting material is varied by having a different size gap for the work function setting material to fill in as a function of fin pitch. It is notable that in the example shown in FIG. 8, the work function setting material layers 802a, 802b, and 802c deposited to a thickness $T_{wsm}$ will result in the work function metal layers 802b and 802c completely filling the spaces in between the fins 302b and 302c, respectively. Since the pitch (and thus the resulting spacing between the fins) in the tight pitch device is less than that of the medium pitch and large pitch devices, then the amount of the work function setting material deposited in the tight pitch device is less than the amount deposited in the medium pitch device, and similarly the amount of the work function metal deposited in the medium pitch device is less than the amount of the work function setting material deposited in the large pitch device. This advantage of the present techniques is shown illustrated in FIG. 8. If so desired, it is not necessary to vary the composition of the work function setting material used in the devices, and embodiments are anticipated herein where the same work function setting material (deposited, e.g., to the same thickness) is used in each of the work function setting material layers 802a, 802b, and 802c.

As described above, an angled deposition process may be employed to deposit the work function setting material. By way of example only, suitable angled deposition processes include, but are not limited to evaporation or sputtering. By employing an angled deposition process, less of the work function setting material will get deposited in the tighter pitch devices. See FIG. 9. Specifically, FIG. 9 which follows from FIG. 7 (as an alternate to the deposition process used to deposit the work function setting material in FIG. 8) illustrates how when an angled deposition process is used to deposit the work function setting material, less of the work function setting material gets deposited between the medium pitch devices as compared to the large pitch devices, and more of the work function setting material gets deposited between the medium pitch devices as compared to the tight pitch devices. The reason for this variable deposition amount is that, depending on the angle of deposition, adjacent gate stacks will "shadow" each other. In this example, with a deposition angle θ of from about 5 degrees to about 45 degrees, the gate stacks in the medium pitch and tight pitch devices will shadow each other resulting in a lesser amount of the work function setting material getting deposited between the gate stacks in these devices. Further, accordingly, the tight pitch devices will receive less work function setting material between the gate stacks than the medium pitch devices due to this shadowing effect.

Figure 10:
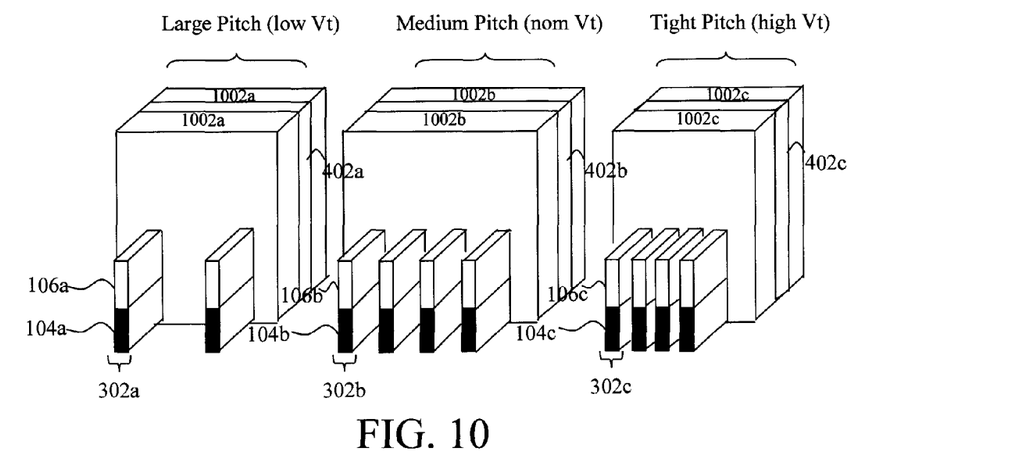
FIG. 10 is a three-dimensional diagram illustrating completion of the gate stacks and offset spacers having been formed on opposite sides of the gate stacks according to an embodiment of the present invention.

Switching back to a cross-sectional view of the device, FIG. 10 illustrates the remainder of gate stack formation and patterning. The work function setting material is capped with more gate metal and/or other gate capping layers which may include for example polysilicon, tungsten (W) and/or silicon nitride (SiN). This completed gate stack is then patterned into gate lines (depicted here as 402a, 402b, and 402c), which preferably run perpendicular to the fins. The gates may be patterned by, for example, lithography and RIE. Offset spacers (depicted here as 1002a, 1002b, and 1002c) are then formed on either side of gate stack respectively. These spacers can be formed by, for example, a conformal deposition of a dielectric material followed by an anisotropic RIE with an overetch long enough to clear the sidewalls of the fins. According to an exemplary embodiment, the offset spacers include silicon nitride (SiN).

Figure 11:
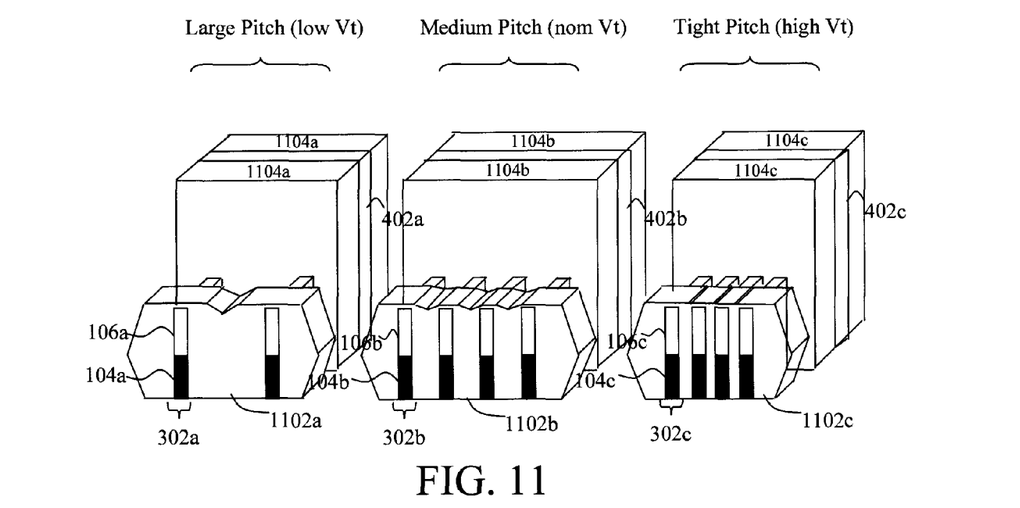
FIG. 11 is a three-dimensional diagram illustrating source and drain regions of the device having been formed according to an embodiment of the present invention.

FIG. 11 illustrates the formation of either a source region or a drain region on one side of the gate, however it is to be understood that the same processes apply to forming the counterpart source region or drain region on the opposite side of the gate. Extension implants into fins 302a, 302b, and 302c in the source/drain regions is also performed. As shown in FIG. 11, epitaxial silicon 1102a, 1102b, and 1102c is seeded from the fins 302a, 302b, and 302c, respectively (in the source and drain regions of the device). Offset spacers 1002a, 1002b, and 1002c (see FIG. 10) may be removed and replaced by final spacers 1104a, 1104b, and 1104c, respectively. Source/drain implants are then introduced to the region, followed by a rapid thermal anneal. As a result, source/drain regions of each of the devices are formed. Silicide contacts (not shown) to the source/drain regions may also be formed. The specific parameters for source region/drain region and silicide formation techniques are well known to those of skill in the art and thus are not described further herein. Any additional standard processing steps may also be performed, if so desired, to the device structure.

The present techniques are now described further by way of reference to the following non-limiting example.

Example 14 nm SOI FIN FET

Figure 12:
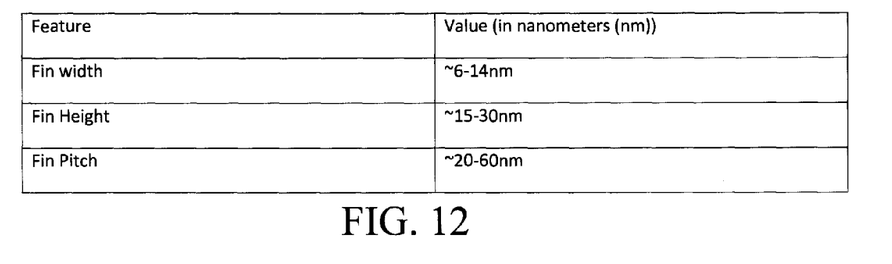
FIG. 12 is a table of FIN details of an exemplary device produced using the present process according to an embodiment of the present invention.

Exemplary device dimensions are provided in FIG. 12. Exemplary Fin width values range from about 6 nm to about 14 nm, Fin Height values range from about 15 nm to about 30 nm, and Fin Pitch values range from about 20 nm to about 60 nm. For an exemplary fin width of 12 nm, Fin Height of 27 nm, Fin Pitch of 40 nm, interfacial oxide thickness of 1 nm, and hi-k dielectric thickness of 2 nm, and a gate metal thickness of 2 nm, the trench in which gate work function engineering occurs is 18 nm wide and 27 nm tall, yielding an aspect ratio of 1:1.5. Thus, work function modulation could be achieved using a CVD process which deposits differently in trenches with aspect ratios of, for example, 1:1, 1:1.5, and 1:2 by increasing the fin pitch to 49 nm for some devices and decreasing the fin pitch to 35.5 nm for other devices.

Figure 13A:
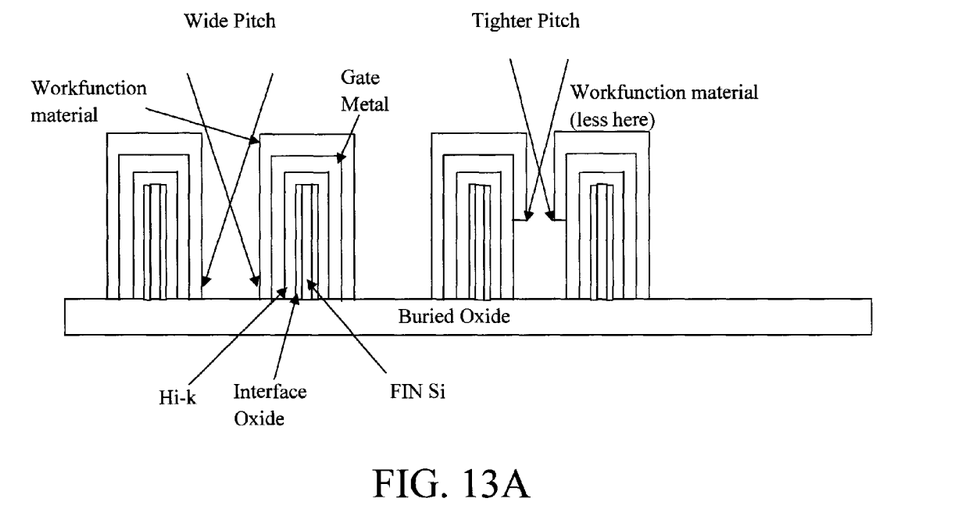
FIG. 13A is a cross-sectional diagram illustrating how with a tighter FIN pitch, less of the work function setting material gets deposited when an angled deposition process is employed according to an embodiment of the present invention.
Figure 13B:
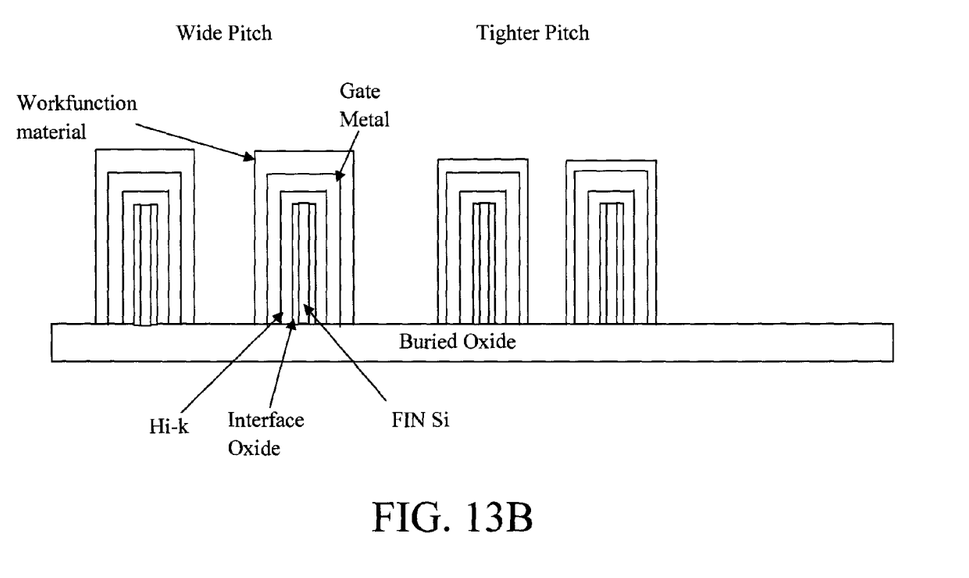
FIG. 13B is a cross-sectional diagram of the structure in FIG. 13A after a diffusion anneal has been used to spread the work function setting material evenly across the fin sidewall, resulting in a thinner film on the tight pitch fins according to an embodiment of the present invention.

In another embodiment, an angled evaporation approach could be used to modulate thickness of work function setting material on the fins. As illustrated in FIG. 13A, neighboring fins shadow progressively more of an angled evaporation as the fin pitch is decreased. As illustrated in FIG. 13B, the work function setting material would then diffuse along the surface area of the fin during subsequent anneals, such as the dopant activation anneal, resulting in a thinner overall film of work function setting material on the tighter pitch fins.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A FIN field effect transistor (FET) device, comprising:
   a semiconductor-on-insulator (SOI) wafer comprising an oxide layer and a SOI layer over a buried oxide (BOX), and a plurality of fins patterned in the oxide layer and the SOI layer such that at least one first group of the fins which corresponds to at least one first FIN FET device has at least one first pitch, and at least one second group of the fins which corresponds to at least one second FIN FET device has at least one second pitch;
   an interfacial oxide on the fins; and
   gate stacks on the interfacial oxide, each of the gate stacks having (i) a conformal gate dielectric layer present on the interfacial oxide, (ii) a conformal gate metal layer on the conformal gate dielectric layer, and (iii) a conformal work function setting material layer on the conformal gate metal layer, wherein the conformal work function setting material layer is configured to act as a doping source to alter a work function of the gate stacks, and
   wherein an amount of the conformal gate metal layer and an amount of the conformal work function setting material layer present in the gate stacks varies proportionally to a pitch of the fins since there are different size gaps to fill between the fins based on the pitch of the fins, and wherein variations in the amount of the conformal work function setting material layer on the fins alters a threshold voltage of the FIN FET devices, and thus by having the fins patterned so as to have the at least one first pitch and the at least one second pitch the amount of the conformal work function setting material layer is varied by having the different size gaps for the work function material to fill in as a function of the pitch of the fins so as to configure the at least one first FIN FET device to have a threshold voltage that is different from a threshold voltage of the at least one second FIN FET device.

2. The FIN FET device of claim 1, wherein the SOI layer comprises a semiconductor material selected from the group consisting of: silicon, germanium, silicon germanium, and silicon carbon.

3. The FIN FET device of claim 1, wherein the interfacial oxide has a thickness of from about 0.5 nm to about 10 nm.

4. The FIN FET device of claim 1, wherein the conformal gate dielectric layer comprises a high-k dielectric material.

5. The FIN FET device of claim 4, wherein the high-k dielectric material comprises hafnium oxide.

6. The FIN FET device of claim 1, wherein the conformal gate dielectric layer has a thickness of from about 1 nm to about 5 nm.

7. The FIN FET device of claim 1, wherein the conformal gate metal layer comprises one or more of titanium nitride and tantalum nitride.

8. The FIN FET device of claim 1, wherein the conformal gate metal layer has a thickness of from about 5 nm to about 20 nm.

9. The FIN FET device of claim 1, wherein the conformal work function setting material layer comprises a metal selected from the group consisting of aluminum, dysprosium, gadolinium, and ytterbium.

10. The FIN FET device of claim 1, wherein the conformal work function setting material layer comprises a metal selected from the group consisting of lanthanum, titanium, and tantalum.

11. The FIN FET device of claim 1, wherein the conformal work function setting material layer has a thickness of from about 5 nm to about 20 nm.

12. The FIN FET device of claim 1, further comprising:
    spacers on opposite sides of the gate stack.

13. The FIN FET device of claim 1, further comprising:
    epitaxial silicon present over the fins in source and drain regions of the device.

14. The FIN FET device of claim 1, wherein the fins have a pitch of from about 20 nm to about 80 nm.

15. The FIN FET device of claim 1, wherein the at least one first pitch is from about 20 nm to about 40 nm and the at least one second pitch is from about 40 nm to about 80 nm.

\* \* \* \* \*